US005798823A

United States Patent [19]

Kudo

[11] Patent Number: 5,798,823
[45] Date of Patent: Aug. 25, 1998

[54] ILLUMINATION OPTICAL APPARATUS AND PROJECTION EXPOSURE APPARATUS USING IT

[75] Inventor: Yuji Kudo, Kawasaki, Japan

[73] Assignee: Nikon Corporation, Japan

[21] Appl. No.: 559,398

[22] Filed: Nov. 15, 1995

[30] Foreign Application Priority Data

Nov. 21, 1994 [JP] Japan ................... 6-286217

[51] Int. Cl.$^6$ ................... G03B 27/42; G03B 27/54
[52] U.S. Cl. ................... 355/67; 355/53
[58] Field of Search ................... 355/53, 55, 67, 355/71

[56] References Cited

U.S. PATENT DOCUMENTS

| | | | |
|---|---|---|---|
| 4,732,842 | 3/1988 | Kira | 355/53 |
| 4,970,546 | 11/1990 | Suzuki et al. | 355/53 |
| 5,432,588 | 7/1995 | Kamon | 355/71 |
| 5,636,003 | 6/1997 | Tanitsu et al. | 355/67 |
| 5,661,546 | 8/1997 | Taniguchi | 355/53 |

FOREIGN PATENT DOCUMENTS

| | | |
|---|---|---|
| 62-123423 A | 6/1987 | Japan . |
| 63-63028 A | 3/1988 | Japan . |
| 6-188174 | 7/1994 | Japan . |
| 6-216008 | 8/1994 | Japan . |

*Primary Examiner*—R. L. Moses
*Assistant Examiner*—Shival Virmani
*Attorney, Agent, or Firm*—Pennie & Edmonds LLP

[57] ABSTRACT

The illumination optical apparatus of this invention is so arranged that light from a discharge lamp is collected by a rotationally symmetric collector mirror, the thus collected light is collimated into nearly parallel light by a collimator optical system, an optical integrator splits the parallel light into a plurality of light beams to form a plurality of secondary light sources, and thereafter the light from the secondary light sources is projected through a condenser optical system. A secondary light source distribution shaping portion is provided for shaping a light intensity distribution of the plural secondary light sources into a predetermined light intensity distribution, the two electrodes of the anode and cathode in the same discharge lamp are located in a predetermined relation, and an entrance surface of the optical integrator is located at a predetermined position with respect to a position where an image of a reflecting surface of the rotationally symmetric collector mirror is formed by the same collimator optical system.

30 Claims, 14 Drawing Sheets

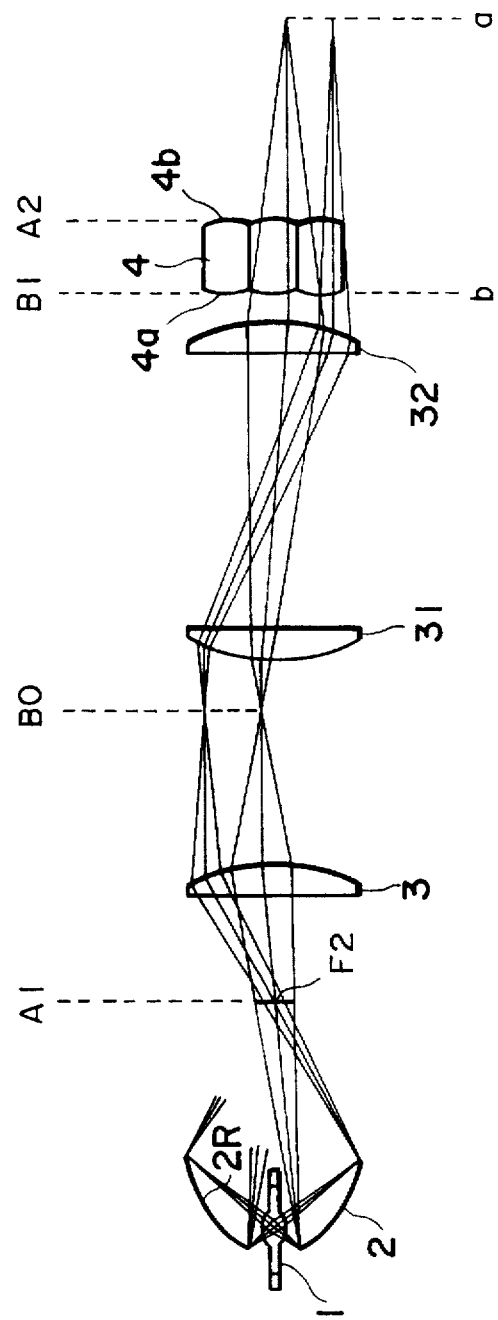

ILLUMINATION OPTICAL APPARATUS AND PROJECTION EXPOSURE APPARATUS USING IT

BACKGROUND OF THE INVENTION

1. Field of the Invention

The present invention relates to an illumination optical apparatus suitably applicable to projection exposure apparatus for fabricating semiconductor devices etc. by projection printing of a pattern of a photomask on a photosensitive substrate.

2. Related Background Art

The configuration shown in FIG. 1 is known as a conventional illumination optical apparatus of this type. Light emitted from a super-high pressure mercury lamp 1 disposed at a first focus position F1 of an ellipsoidal mirror 2 is reflected and collected by the ellipsoidal mirror 2 to be focused at a position A1 of a second focus F2 of the ellipsoidal mirror 2 and thereafter to be collimated into nearly parallel light beams by a collimator lens 3, then entering a fly's eye lens 4 as an optical integrator. Here, the light incident into the fly's eye lens 4 is split into a plurality of light beams by the fly's eye lens 4, which form respective secondary light sources at a position A2 on the side of exit surfaces 4b of respective lens elements (41–43) composing the fly's eye lens 4. Light from these plural secondary light sources is limited by an aperture stop 5 having a circular aperture, and thereafter is condensed by a condenser lens 6 to illuminate a reticle R as an illuminated surface in a superimposed manner. The circuit pattern on the reticle R uniformly illuminated by the above illumination optical apparatus is projected through a projection optical system onto a substrate W, such as a wafer, coated with a photoresist. On this occasion, the position A2 of the plural secondary light sources formed by the fly's eye lens 4 or the aperture stop 5 is conjugate with a position of an aperture stop 7a disposed at a pupil position A3 inside the projection optical system 7, and plural images of the secondary light sources are formed on the aperture stop 7a, thus achieving so-called Köhler illumination.

SUMMARY OF THE INVENTION

The present invention relates to an illumination optical apparatus which has a discharge lamp for emitting light, a rotationally symmetric collector mirror for reflecting and collecting the light from the discharge lamp to form a light source image, a collimator optical system for collimating light from the light source image formed by the rotationally symmetric collector mirror into nearly parallel light, an optical integrator for splitting the light from the collimator optical system into a plurality of beams and forming a plurality of secondary light sources, and a condenser optical system for condensing light from the plurality of secondary light sources formed by the optical integrator to illuminate an illuminated surface in a superimposed manner, which further has a secondary light source distribution shaping means for shaping a light intensity distribution of the same plurality of secondary light sources into a predetermined light intensity distribution, in which the above discharge lamp has two electrodes of an anode and a cathode disposed as opposed to each other along and on a rotation axis of the rationally symmetric collector mirror, in which the anode is disposed on the side of the vertex of the rotationally symmetric collector mirror with respect to the cathode, and in which an entrance surface of the optical integrator is located at a defocused position shifted to the discharge lamp side from a position where an image of a reflecting surface of the rotationally symmetric collector mirror is formed by the above collimator optical system.

This can largely increase light intensities of peripheral portions in the light beam entering the optical integrator and in those the secondary light sources formed by the optical integrator, whereby the illuminated surface can be illuminated at a high illumination efficiency in the normal illumination method or in any illumination method, such as oblique illumination. Accordingly, if it is applied as an illumination optical apparatus for exposure apparatus for transferring the pattern of reticle onto the wafer through the projection optical system, exposure can be realized with a high throughput in any illumination method including the normal illumination and oblique illumination.

Based on the above configuration, a preferred embodiment may be so arranged that the secondary light source distribution shaping means has first and second aperture stops arranged as switchable on or near the exit surface of the optical integrator, the one first aperture stop has a circular aperture rotationally symmetric with respect to the optical axis of the condenser optical system, and the other second aperture stop has aperture portions in peripheral areas offset from the optical axis of the condenser optical system and has a light-shielding portion or light-reducing portion in the central area passing the optical axis of the condenser optical system. By this, the normal illumination and oblique illumination can be selectively realized for the illuminated surface at a high illumination efficiency and in a simple structure. Therefore, when the apparatus of the present invention is applied to illumination apparatus in exposure apparatus, exposure can be achieved with a high throughput in any arbitrarily selected illumination method including the normal illumination and oblique illumination.

In a preferred embodiment, the collimator optical system has a collimator lens for forming an image of the reflecting surface of the rotationally symmetric collector mirror and collimating the light from the light source image formed by the rotationally symmetric collector mirror, and a relay lens for reimaging the image of the reflecting surface of the rotationally symmetric collector mirror formed by the collimator lens.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

BRIEF DESCRIPTION OF THE DRAWINGS

FIG. 23 is a drawing to diagrammatically show a modification of the embodiment shown in FIG. 16, which has a relay lens.

DESCRIPTION OF THE PREFERRED EMBODIMENTS

Figure 1:
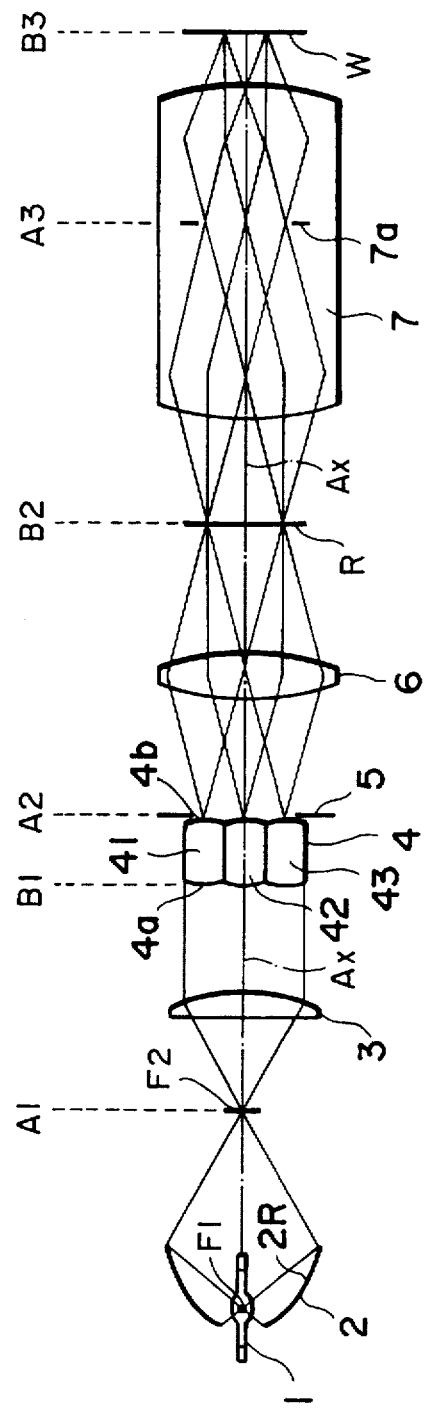
FIG. 1 is a drawing to show a configuration of a convention apparatus.

Recently, attention is directed toward the technology to further improve the resolving power and the depth of focus originally owned by the projection optical system 7 by modifying the shape of the secondary light sources formed by the fly's eye lens and obliquely illuminating the reticle R, based on the structure as shown in FIG. 1.

Figure 2:
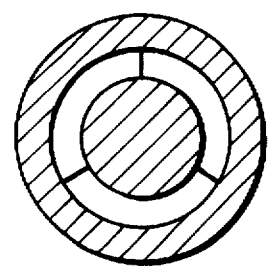
FIG. 2 is a plan view to show a configuration of an aperture stop having an annular aperture.

For example, Japanese Laid-open Patent Application No. 5-175101 etc. describe the technique to improve the resolving power and depth of focus of the projection optical system 7 by providing the aperture stop 5 disposed on the exit side of the fly's eye lens 4 with an aperture portion of an annular shape (doughnut shape) as shown in FIG. 2 and thereby forming an annular shape of secondary light sources to obliquely illuminate the reticle R. In the following description, an annular illumination method is used for the illumination method for obliquely illuminating an illuminated object while forming the annular shape of secondary light sources.

Figure 3:
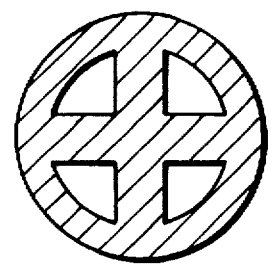
FIG. 3 is a plan view to show a configuration of an aperture stop having four offset aperture portions.

Further, Japanese Laid-open Patent Application No. 4-101148 etc. describe the technique to further improve the resolving power and depth of focus of the projection optical system 7, more than those in the annular illumination method, by providing the aperture stop 5 disposed on the exit side of the fly's eye lens 4 with four aperture portions offset as shown in FIG. 3 and thereby forming four offset regions of secondary light sources to obliquely illuminate the reticle R (which will be referred to as special oblique illumination). In the following description, a special illumination method is used for the illumination method to obliquely illuminate an illuminated object while forming a plurality of secondary light sources offset from the optical axis.

Figure 4:
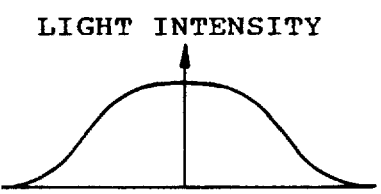
FIG. 4 is a drawing to show a state of light intensity distribution on the entrance surface of the fly's eye lens in the conventional apparatus shown in FIG. 1.
Figure 5:
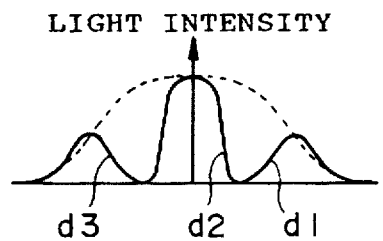
FIG. 5 is a drawing to show a state of light intensity distribution on the exit surface of the fly's eye lens in the conventional apparatus shown in FIG. 1.

The above techniques, however, show the profile of light intensity distribution as shown in FIG. 4 on the entrance surface 4a of the fly's eye lens, wherein the intensity is high in the central portion but gradually decreases to the periphery. Further, the above techniques have a trend of light intensity distribution as shown in FIG. 5 as to the plurality of secondary light sources formed on the exit surface 4b of the fly's eye lens.

This will be explained in more detail. First, let us suppose the fly's eye lens 4 has, for example, three lens elements 41-43 as shown in FIG. 1. Then, d1, d2, d3 as represented by the solid lines in FIG. 5, represent light intensity distributions of light source images formed on the exit side by the lens elements 41, 42, 43, respectively. As shown, the light intensity distributions d1, d3 of the light source images formed by the lens elements 41 and 43 located in the periphery of the fly's eye lens 4 are weaker than the light intensity distribution d2 of the light source image formed by the lens element 42 located in the central portion of the fly's eye lens 4; an envelope connecting the peaks of the light intensities formed by the respective lens elements 41-43 becomes a light intensity distribution as shown by the dashed line in FIG. 5, which is similar to the light intensity distribution on the entrance surface 4a of the fly's eye lens 4 as shown in FIG. 4.

Accordingly, if the aperture stop with the annular aperture in the periphery as shown in FIG. 2 or the aperture stop with the four offset apertures in the periphery as shown in FIG. 3 is placed at the position where the plurality of secondary light sources are formed, the utility factor of light beams becomes extremely lowered, which would result in greatly decreasing the illuminance on the illuminated surface such as a reticle R, thereby making the exposure time longer and causing a great drop of the throughput.

Next explained is a principle of the present invention. Discussed with FIGS. 4 and 5 was the point that the light intensity distribution was high in the central portion but became lower toward the periphery before and after the fly's eye lens as an optical integrator. This point was studied in various aspects and it was found that the phenomenon caused by a characteristic of luminous intensity distribution due to the shape of the electrodes in the super-high pressure mercury lamp 1 as a discharge lamp disposed at the first focus position of the ellipsoidal mirror 2 as a rotationally symmetric collector mirror.

Figure 6:
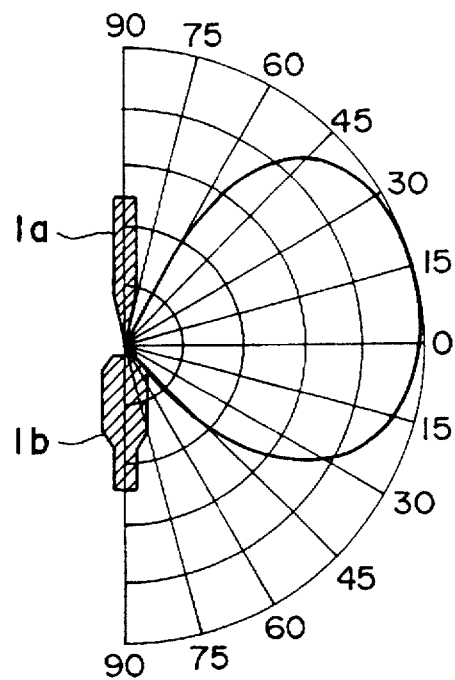
FIG. 6 is a drawing to show a state of luminous intensity distribution caused by the electrode structure of a mercury arc lamp.

This will be explained in further detail. Tip portions of the electrodes of the super-high pressure mercury lamp are formed as shown in FIG. 6: the cathode 1a has the tip of a needlelike shape while the anode 1b has the tip of a shape of a truncated circular cone obtained by cutting the top part including the vertex from a circular cone; the anode of the super-high pressure mercury lamp is normally arranged to be larger than the cathode. Because of this arrangement, when a high voltage is applied between the two electrodes of the super-high pressure mercury lamp, the characteristic of luminous intensity distribution of the light generated by discharge at the two electrodes will show such a luminous intensity distribution as shown in FIG. 6, in which the luminous intensity is almost constant from the horizontal direction (0 degree) up to near 45 degrees on the side of cathode 1a, but the light quickly attenuates because of eclipse by the anode itself over near 30 degrees on the side of anode 1b.

Figure 7:
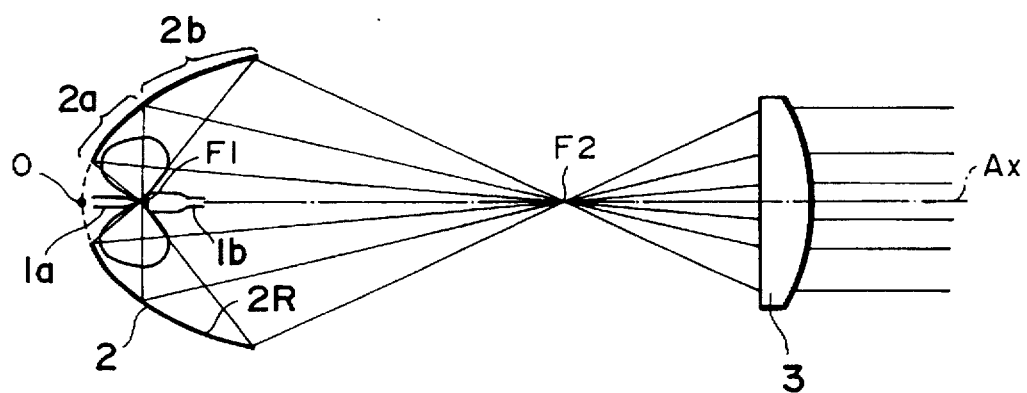
FIG. 7 is a drawing to show a state of light incident from the mercury arc lamp having the luminous intensity distribution shown in FIG. 6 into the fly's eye lens.

In the conventional apparatus, the two electrodes of the cathode 1a and anode 1b in the super-high pressure mercury lamp are arranged as opposed to each other near the first focus F1 and along and on the rotation axis (or optical axis Ax) of the ellipsoidal mirror 2 as a rotationally symmetric collector mirror, and the cathode 1a is located on the side of the vertex O of the ellipsoidal mirror with respect to the anode 1b, as shown in FIG. 7.

Because of this arrangement, as shown in FIG. 7, the light emitted from the electrodes of the super-high pressure mercury lamp, having the characteristic of constant luminous intensity distribution from the vertical direction (0 degree) to near 45 degrees on the side of cathode 1a, is reflected by an inside portion 2a of the ellipsoidal mirror 2 and thereafter is condensed by the collimator lens 3 to illuminate the central portion of the fly's eye lens 4. On the other hand, the light emitted from the electrodes of the super-high pressure mercury lamp, having the characteristic of nearly constant luminous intensity distribution from the vertical direction (0 degree) to near 30 degrees on the side of anode 1b, is reflected by an outside portion 2b of the ellipsoidal mirror 2 and thereafter is condensed by the collimator lens 3 to illuminate the periphery of the fly's eye lens 4.

Consequently, it is understood that the light intensity distribution on the entrance side of the fly's eye lens 4 is high in the central portion but becomes weaker toward the periphery, as shown in FIG. 4.

The present invention positively utilizes the characteristic of luminous intensity distribution of the super-high pressure mercury lamp as shown in FIG. 6. Namely, it was found that in order to relatively increase the intensity distribution in the peripheral portion relative to that in the central portion in the incident light entering the fly's eye lens 4, it was effective to locate the anode 1b of the super-high pressure mercury lamp on the side of the vertex O of the collector mirror with respect to the cathode 1a, opposite to the conventionally common practice, which the present invention utilizes.

In that case, it is desired to increase the effective diameter of the collector mirror in order to expand an intake angle on the cathode side.

However, in order to relatively increase the intensity distribution in the periphery to that in the central portion, it is not sufficient only to locate the anode 1b of the super-high pressure mercury lamp on the side of vertex O of the collector mirror with respect to the cathode 1a, opposite to the conventionally common practice, and another important factor is a condition of location of the fly's eye lens 4.

Figure 8:
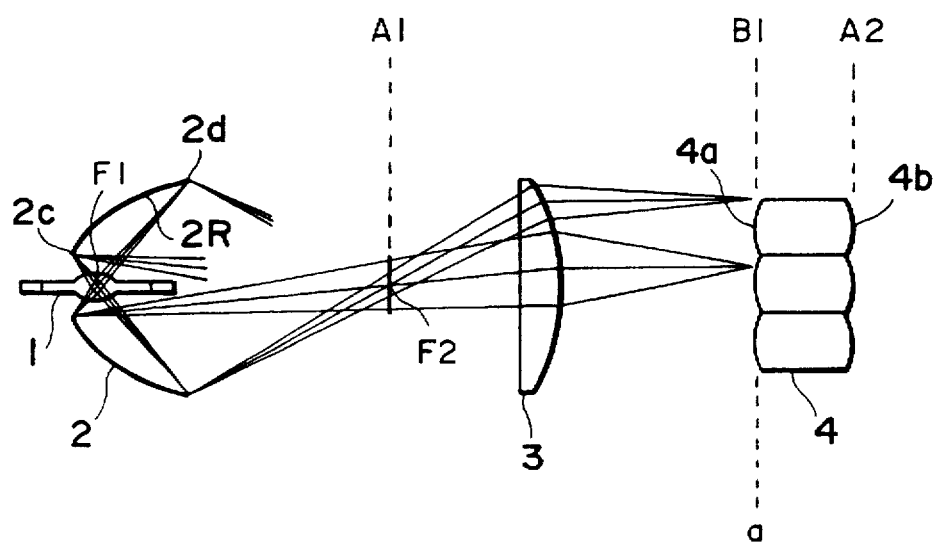
FIG. 8 is a drawing to show a state in which the collimator lens forms an image of the reflecting surface of the ellipsoidal mirror on the entrance surface of the fly's eye lens.

This will be explained in further detail. First, only from the viewpoint of the utility factor of light, it is effective to arrange the reflecting surface of the ellipsoidal mirror 2 as conjugate with the entrance surface 4a of the fly's eye lens 4 with respect to the collimator lens 3, as shown in FIG. 8, thereby making flat (plane) the image of the reflecting surface of the ellipsoidal mirror 2 formed on the entrance surface 4a of the fly's eye lens 4.

However, if they are perfectly conjugate with each other, sharp images of a circular edge 2c of a hollow portion of the ellipsoidal mirror and a circular outer edge 2d are formed on the entrance surface 4a of the fly's eye lens 4, which will cause significant, negative influence on the illuminance uniformity on the illuminated surface R.

It is thus necessary to defocus the position of the image (flat image) of the reflecting surface of the ellipsoidal mirror 2 formed by the collimator lens 3 relative to the entrance surface 4a of the fly's eye lens 4 to such an extent as not to degrade the utility factor of light so much.

On this occasion the intensity distribution on the entrance surface 4a of the fly's eye lens 4 greatly differs depending upon whether the defocus is taken in a plus direction (which is a direction directed toward the illuminated surface) or in a minus direction (which is a direction directed toward the light source).

This will be explained referring to FIG. 9 to FIG. 11.

Figure 9:
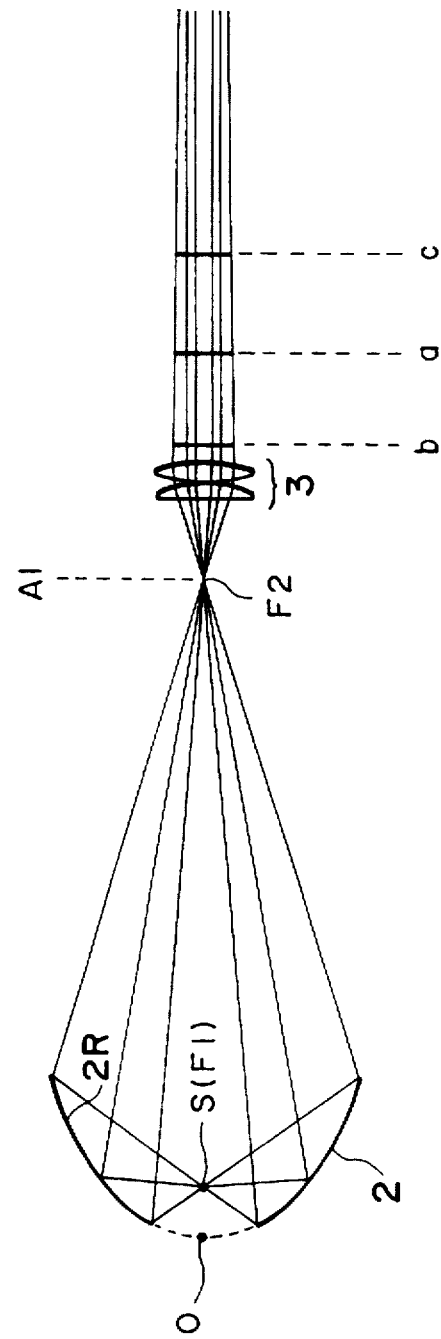
FIG. 9 is an optical path diagram to show a state in which a point light source located on the first focus of the ellipsoidal mirror is condensed by the collimator lens.

FIG. 9 is a drawing to show a state of rays where a point light source S, which isotropically emits light, is placed at the first focus F1 of the ellipsoidal mirror. As shown in FIG. 9, the light from the point light source, reflected by the ellipsoidal mirror 2, is focused at the position A1 of the second focus F2 and thereafter is collimated into nearly parallel light beams by the collimator lens 3. Here, plane a indicates a position of the image plane of the reflecting surface of the ellipsoidal mirror 2 formed by the collimator lens 3, and planes b and c represent planes defocused by a predetermined distance along the directions of the optical axis Ax of the ellipsoidal mirror 2 (or the optical axis Ax of the collimator lens 3) from the image plane a.

Figure 12:
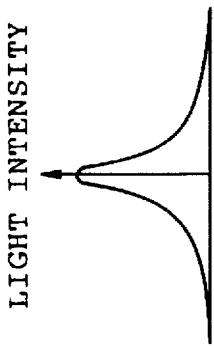
FIG. 12 is a drawing to show a light intensity distribution when light condensed by the collimator lens is hollowed.

In this case, since the light beams from the collimator lens 3 are nearly parallel light beams, the light intensity distribution is in a hollow state in which light intensities are distributed only in the periphery, as shown in FIG. 12, even if the entrance surface 4a of the fly's eye lens 4 disposed on the illuminated surface side of the collimator lens 3 (on the right side of the collimator lens 3 in FIG. 9) is placed at any position out of the planes a to c.

Next, let us discuss a case where the point light source S, which isotropically emits light, is placed at a position shifted along the optical axis from the position of the first focus F1.

Since the ellipsoidal mirror 2 as a reflecting mirror is generally very far from the Herschel's condition, it suddenly gives rise to spherical aberration once an object is located at a position shifted from the first focus position F1 in the direction of the optical axis Ax. For example, if the point light source S is located at a position shifted in the minus direction (the direction toward the vertex O of the ellipsoidal mirror 2) from the first focus F1 of the ellipsoidal mirror 2 along the optical axis Ax, as shown in FIG. 10, the position of the light source image (or the focused position) formed by the ellipsoidal mirror 2 moves from the second focus position F2 in the plus direction (the direction directed toward the illuminated surface) and negative spherical aberration appears. Thus, the light beams passing through the collimator lens 3 are not parallel light, and the light intensity distribution formed on the entrance surface 4a of the fly's eye lens 4 greatly changes depending upon the position of the entrance surface 4a of the fly's eye lens 4 located on the side of the illuminated surface of the collimator lens 3.

Figure 10:
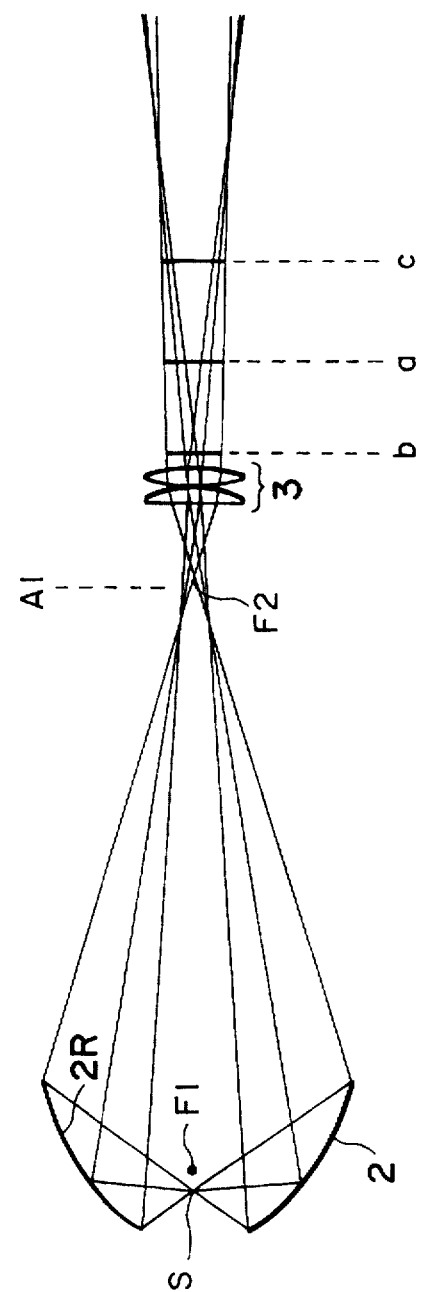
FIG. 10 is an optical path diagram to show a state in which a point light source located as shifted from the first focus of the ellipsoidal mirror toward the vertex of the ellipsoidal mirror is condensed by the collimator lens.

FIG. 10 shows a state of rays where the point light source S, which isotropically emits light, is placed at a position shifted from the position of the first focus F1 of the ellipsoidal mirror to the side of the vertex O of the ellipsoidal mirror 2. In FIG. 10 positions of planes a–c correspond to the positions of the planes a–c, respectively, in FIG. 9.

Figure 13:
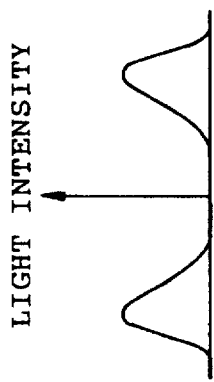
FIG. 13 is a drawing to show a light intensity distribution at a position defocused from the position where the collimator lens forms the image of the reflecting surface of the ellipsoidal mirror, in which the light intensity is increased in the periphery.
Figure 14:
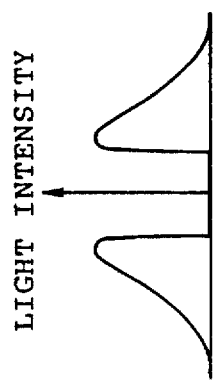
FIG. 14 is a drawing to show a light intensity distribution at a position defocused from the position where the collimator lens forms the image of the reflecting surface of the ellipsoidal mirror, in which the light intensity is increased in the central portion.

When the entrance surface 4a of the fly's eye lens 4 is placed at the position of the plane c defocused in the plus direction (the direction directed toward the illuminated surface) from the image position a of the reflecting surface of the ellipsoidal mirror formed by the collimator lens 3, as shown in FIG. 10, stronger light is irradiated to the peripheral portion than in the central portion of the fly's eye lens 4, thus presenting the light intensity distribution deflected to the periphery, as shown in FIG. 13. On the other hand, if the entrance surface 4a of the fly's eye lens 4 is placed at the position of the plane b defocused in the minus direction (the direction toward the vertex O of the ellipsoidal mirror 2) from the image position a of the reflecting surface of the ellipsoidal mirror formed by the collimator lens 3 in FIG. 10, stronger light is irradiated to the central portion of the fly's eye lens 4 than in the peripheral portion thereof, thus presenting the light intensity distribution deflected to the central portion, as shown in FIG. 14. The light intensity distribution at the image plane position a of the reflecting surface of the ellipsoidal mirror 2 formed by the collimator lens 3 in FIG. 10 is a distribution in a hollow state in which light intensities are distributed only in the periphery, as shown in FIG. 12.

Figure 11:
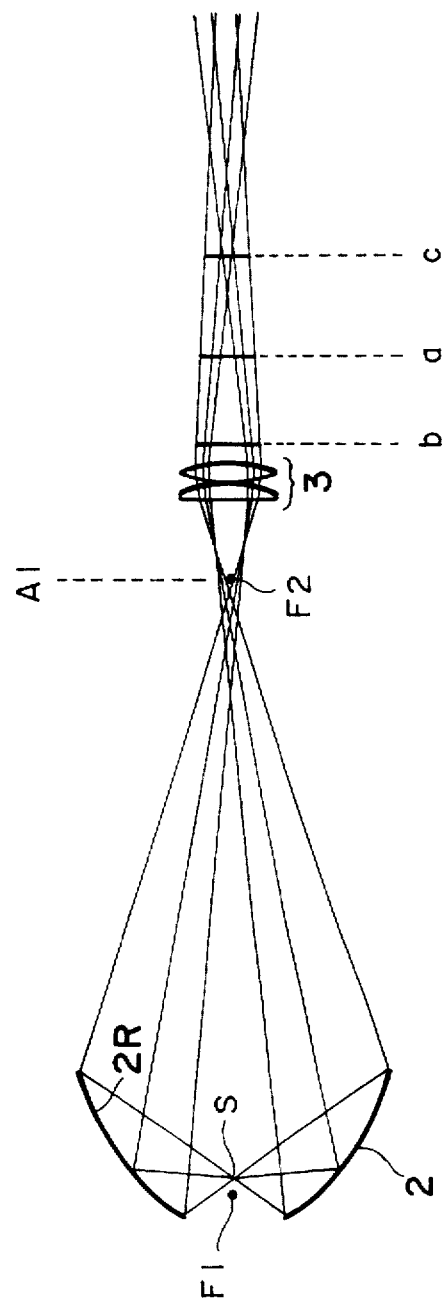
FIG. 11 is an optical path diagram to show a state in which a point light source located as shifted from the first focus of the ellipsoidal mirror toward an illuminated surface is condensed by the collimator lens.

In contrast with it, if the point light source S, which isotropically emits light, is placed at a position shifted in the plus direction (the direction directed toward the illuminated surface) from the first focus F1 along the optical axis Ax, as shown in FIG. 11, the trend becomes opposite to that shown in FIG. 10: the position of the light source image formed by the ellipsoidal mirror 2 (or the focused position) is moved in the minus direction (the direction toward the vertex O of the ellipsoidal mirror 2) from the second focus position F2 and positive spherical aberration appears.

FIG. 11 shows a state of rays where the point light source S, which isotropically emits light, is placed at a position shifted from the position of the first focus F1 of the ellipsoidal mirror in the direction directed to the illuminated surface. Here, positions of planes a–c in FIG. 11 correspond to the positions of the planes a–c, respectively, in FIG. 9 and FIG. 10.

If the entrance surface 4a of the fly's eye lens 4 is placed at the position of the plane c defocused from the image position a of the reflecting surface of the ellipsoidal mirror formed by the collimator lens 3 in the plus direction (the direction directed toward the illuminated surface), as shown in FIG. 11, stronger light is irradiated to the central portion of the fly's eye lens 4 than in the peripheral portion thereof, thus presenting the light intensity distribution deflected to the central portion, as shown in FIG. 14. On the other hand, if the entrance surface 4a of the fly's eye lens 4 is placed at the position of the plane b defocused from the image position a of the reflecting surface of the ellipsoidal mirror formed by the collimator lens 3 in the minus direction (the direction toward the vertex O of the ellipsoidal mirror 2), stronger light is irradiated to the peripheral portion of the fly's eye lens 4 than in the central portion thereof, thus presenting the light intensity distribution deflected to the peripheral portion, as shown in FIG. 13. The light intensity distribution at the image plane position a of the reflecting surface of the ellipsoidal mirror 2 formed by the collimator lens 3 in FIG. 11 is a distribution in a hollow state in which light intensities are distributed only in the periphery, as shown in FIG. 12.

FIG. 9 to FIG. 11 as discussed above show the states of light intensity distributions at the position a of the image plane of the reflecting surface of the ellipsoidal mirror 2, and at the positions (b and c) of the planes defocused by the predetermined amount from the position a, where the point light source S for isotropically emitting light is located at or near the position of the first focus F1 of the ellipsoidal mirror. However, the rays shown in FIG. 9 to FIG. 11 are mixed in practice, because the two electrodes of the anode and cathode are arranged along the direction of the optical axis Ax on either side of the first focus F1 of the ellipsoidal mirror 2 and it can thus be assumed that there is a light source having a substantial size between the two electrodes.

Thus, the optimal position of arrangement of the fly's eye lens 4 is preferably determined taking account of the fact that the rays as shown in FIG. 9 to FIG. 11 are mixed in the light emitted from the super-high pressure mercury lamp 1.

Figure 15:
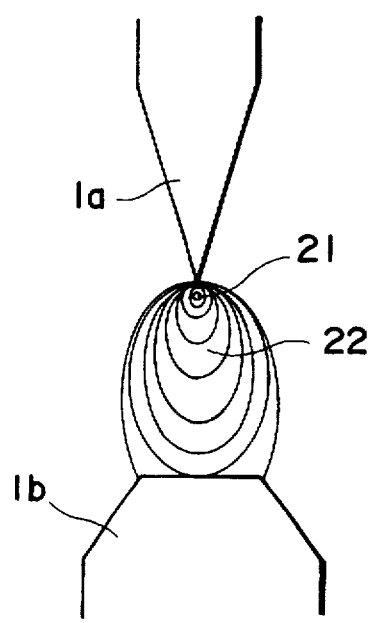
FIG. 15 is a drawing to show a light intensity distribution between the two electrodes in the mercury arc lamp.

First, as described previously, it is necessary to locate the anode 1b of the super-high pressure mercury lamp on the side of the vertex O of the collector mirror with respect to the cathode 1a in order to relatively increase the light intensities in the periphery of the fly's eye lens 4 relative to those in the center. However, the light intensity distribution of a light-emitting point of the super-high pressure mercury lamp 1 shows the highest intensity at a position 21 near the tip of the cathode 1a and becomes decreased as approaching the anode 1b, as shown by isointensity curves between the two electrodes of the mercury lamp in FIG. 15. Therefore, the portion 21 with the highest light intensity is located at a position shifted from the barycenter 22 of the light intensity distribution of the light source to the side of cathode 1a. In order to maximize a quantity of light reaching the fly's eye lens 4, the barycenter 22 of light intensities between the cathode 1a and the anode 1b in the super-high pressure mercury lamp needs to be located near the first focus F1 of the ellipsoidal mirror. Thus, the portion 21 with the highest light intensity near the tip of cathode 1a is located at a position somewhat shifted in the plus direction (the direction toward the illuminated surface) from the first focus position F1 of the ellipsoidal mirror 2.

As a result, the trend for the rays to pass the optical paths shown in FIG. 11, as described above, becomes enhanced, so that the light intensity distribution at the focus position a is one in the hollow state in which light intensities are distributed only in the periphery, as shown in FIG. 12, and the light intensity distribution at the defocus position b is one in which light intensities in the periphery are somewhat stronger than those in the central portion, as shown in FIG. 13. Further, the light intensity distribution at the defocus position c is one in which light intensities in the central portion are highest and gradually decrease as approaching the periphery.

Accordingly, it is understood that in order to illuminate the illuminated surface at a high illumination efficiency in any illumination method including the normal illumination and oblique illumination, it is optimal to place the entrance surface 4a of the fly's eye lens 4 at the defocus position b (which is the position defocused from the position a of the image of the reflecting surface of the collector mirror 2 formed by the collimator lens 3 to the discharge lamp side) to achieve the light intensity distribution in which light intensities in the periphery are somewhat stronger than those in the central portion, as shown in FIG. 13.

According to the above principle, the light intensities in the periphery of the fly's eye lens are increased relative to those in the central portion. Accordingly, a quantity of shielded light can be considerably decreased as compared with the conventional illumination optical systems, of course when the normal illumination is employed using the aperture stop with a circular aperture, which is one of the secondary light source distribution shaping means for setting or shaping the light intensity distribution of plural secondary light sources formed by the fly's eye lens 4 to a predetermined light intensity distribution, when oblique illumination is effected by forming an annular zone of secondary light sources with an aperture stop as shown in FIG. 2 or the like, which is one of the secondary light source distribution shaping means, or when oblique illumination is effected by forming four offset regions of secondary light sources with the aperture stop as shown in FIG. 3 or the like. Then it becomes possible to prevent a drop of the throughput.

Figure 16:
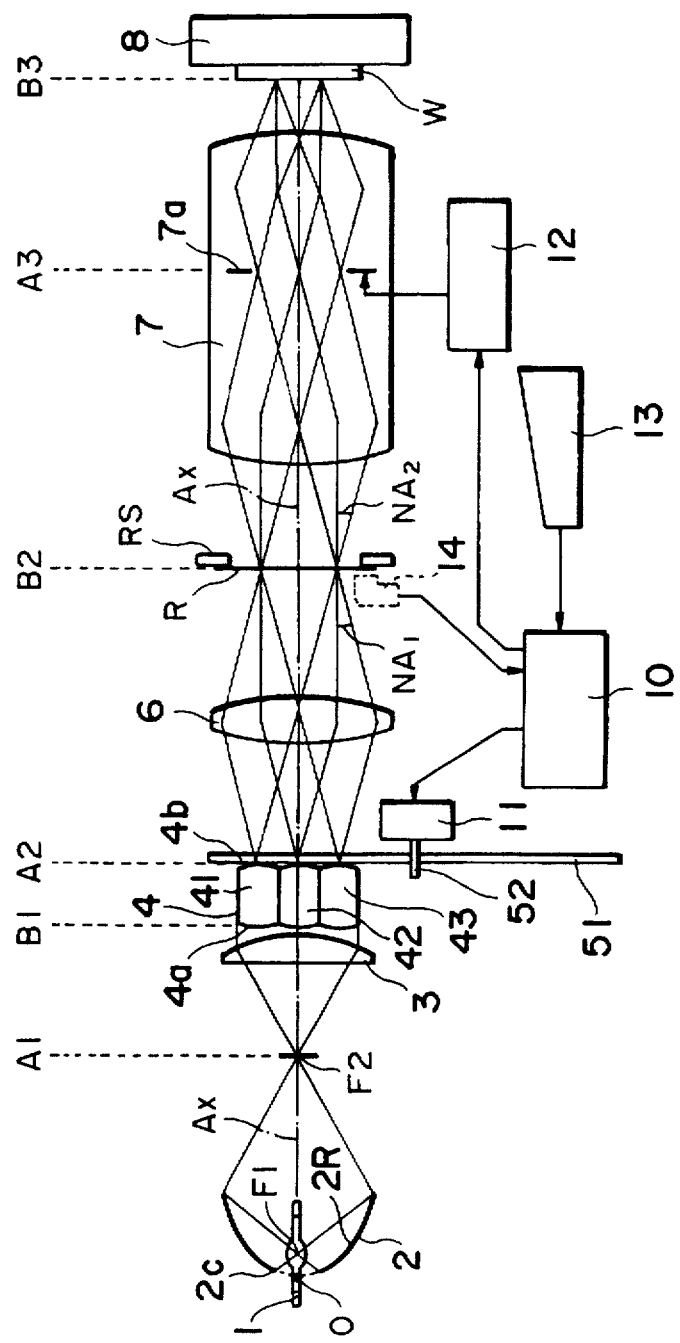
FIG. 16 is a drawing to show a configuration of an embodiment of the present invention.

FIG. 16 shows an example in which the illumination optical apparatus of the present invention is applied to an exposure apparatus for fabricating semiconductor devices. In FIG. 16, members having same functions are denoted by same reference numerals as those in FIG. 1. This embodiment is next described in detail referring to FIG. 16.

The light source 1, for example a mercury arc lamp as a discharge lamp for emitting the light such as the g-line (436 nm) or the i-line (365 nm), is set approximately at the first focus position F1 of the ellipsoidal mirror 2 as a rotationally symmetric reflecting mirror, and light beams from this light source 1 are reflected and collected by the collector mirror 2 having a circular aperture portion 2c and an ellipsoidal reflecting surface 2R to form a light source image of the light source 1 at the position A1 of the second focus position F2 of the ellipsoidal mirror 2.

Figure 17:
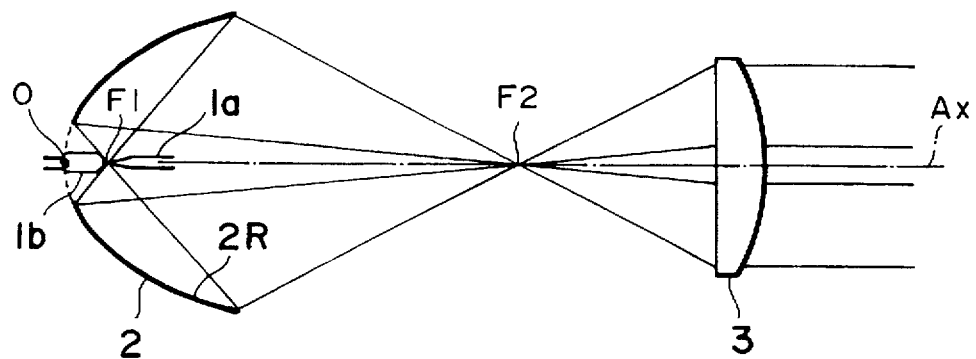
FIG. 17 is a drawing to show a state of arrangement of the electrodes in the mercury arc lamp as a light source in the embodiment shown in FIG. 16.

FIG. 17 shows the layout and structure of the electrodes of the mercury arc lamp 1 with respect to the ellipsoidal mirror 2. As shown in FIG. 17, the anode 1b is located on the side of the vertex O of the ellipsoidal mirror 2 with respect to the cathode 1a along the optical axis Ax of the ellipsoidal mirror 2 as a rotation axis of the rotationally symmetric reflecting mirror. In other words, the two electrodes of cathode 1a and anode 1b are arranged as opposed to each other so that the cathode 1a is located on the illuminated surface side relative to the anode 1b. On this occasion, the two electrodes of cathode 1a and anode 1b are arranged on either side of the first focus F1 of the ellipsoidal mirror 2. More specifically, the electrodes are arranged so that the position of the barycenter of the light intensity distribution generated by discharge between the cathode 1a and the anode 1b is substantially coincident with the first focus F1 of the ellipsoidal mirror 2.

The light beams once forming the light source image at the position A1 of the second focus position F2 of the ellipsoidal mirror 2 by the reflecting and collecting functions thereof are converted into nearly parallel light beams by the collimator lens 3 as a collimator optical system arranged so that the front focus thereof is located at the light source image position F2. After that, the parallel light beams are incident into the fly's eye lens 4 functioning as an optical integrator.

The fly's eye lens 4 is an aggregate of plural lens elements 41–43 each having a circular or polygonal (rectangular, hexagonal, etc.) cross section in bundle, and a plurality of light source images are formed at the exit surface of the fly's eye lens 4 or at the position A2 near the exit surface, thus substantially forming the secondary light sources here. Although the lens elements 41–43 in the present embodiment have a biconvex shape, one surface may be plane or concave, or further, they may be biconcave.

Figure 18:
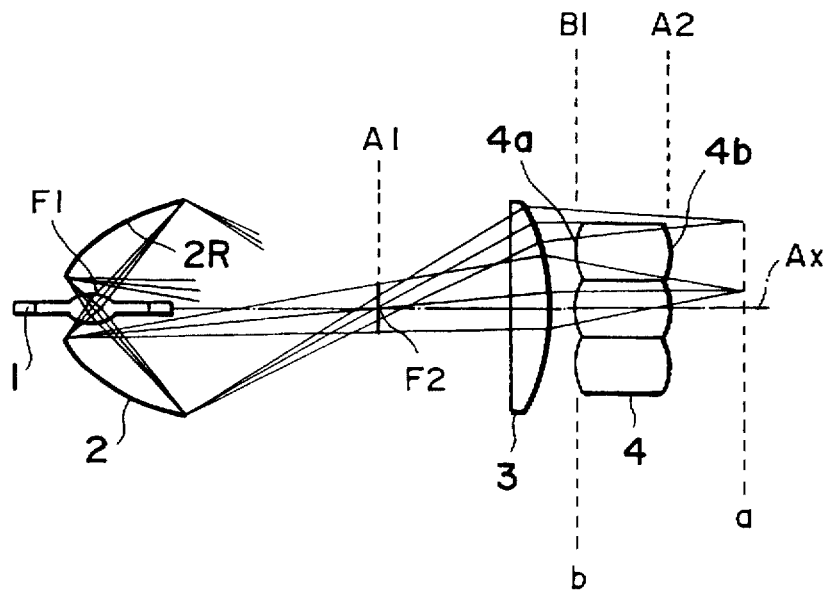
FIG. 18 is a drawing to diagrammatically show a state of imaging relation of the collimator lens due to the electrode arrangement of the mercury arc lamp shown in FIG. 17.

Here, the fly's eye lens 4 in the present embodiment is positioned in a specific relation relative to the collimator lens 3. This is described in detail. First, the collimator lens 3 has a function to form an image of the reflecting surface 2R of the ellipsoidal mirror 2 at a predetermined position a on the illuminated surface side of the collimator lens 3, as shown in FIG. 18, in addition to a function to collimate light beams from the light source image formed by the ellipsoidal mirror 2. At this time, the collimator lens 3 forms a flat or plane image of reflecting surface 2R from the curved reflecting surface 2R (object) of the ellipsoidal mirror 2.

In the present embodiment, as shown in FIG. 18, the entrance surface 4a of the fly's eye lens 4 is placed at the position b defocused from the image position a of the reflecting surface 2R of the ellipsoidal mirror 2 formed by the collimator lens 3 to the light source side, taking account of the light intensity distribution characteristic on the exit side of the collimator lens 3 resulting from the light intensity distribution between the two electrodes 1a, 1b opposed to each other on either side of the first focus F1 of the ellipsoidal mirror 2 on the optical axis Ax of the ellipsoidal mirror 2 (or collimator lens 3).

Accordingly, the present embodiment synergistically achieves the effect that stronger light is guided to the periphery rather than to the center of the fly's eye lens 4 by placing the anode 1b on the side of the vertex O of the ellipsoidal mirror 2 relative to the cathode 1a, and the effect that the collimator lens 3 forms the light intensity distribution in which light intensities are stronger in the periphery than in the center on the entrance surface 4a of the fly's eye lens 4 by placing the entrance surface of the fly's eye lens 4 at the position b defocused from the image position a of the reflecting surface 2R of the ellipsoidal mirror 2 formed by the collimator lens 3 to the light source side.

Figure 19:
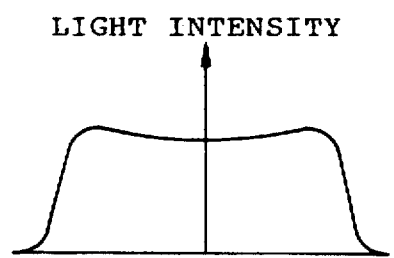
FIG. 19 is a drawing to show a state of light intensity distribution on the entrance surface of the fly's eye lens in the embodiment shown in FIG. 16.

As a result, as shown in FIG. 19, intensities in the periphery increase relative to those in the central portion on the entrance surface of the fly's eye lens 4 in the present embodiment, thereby forming an approximately flat light intensity distribution from the central portion to the periphery as compared with the light intensity distribution on the entrance surface of the fly's eye lens 4 in the conventional apparatus as shown in FIG. 4. The fly's eye lens 4 in the present embodiment has the three lens elements 41–43 as shown in FIG. 16, and light intensity distributions of light source images formed on the exit side by the lens elements 41, 42, 43 are d1, d2, d3, respectively, as shown by the solid lines in FIG. 20.

Figure 20:
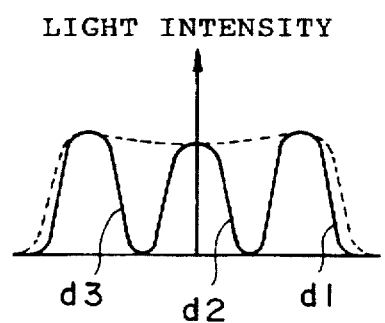
FIG. 20 is a drawing to show a state of light intensity distribution on the exit surface of the fly's eye lens in the embodiment shown in FIG. 16.

As shown by the solid lines in FIG. 20, the light intensity distributions d1, d3 of the light source images formed by the lens elements 41 and 43 located in the periphery of the fly's eye lens 4 are greater than the light intensity distribution d2 of the light source image formed by the lens element 42 located in the central portion. As a result, an envelope connecting the peaks of the light intensity distributions formed by the respective lens elements 41–43 becomes a light intensity distribution as shown by the dashed line in FIG. 20, which is similar to the light intensity distribution on the entrance surface 4a of the fly's eye lens 4 as shown in FIG. 19.

Figure 21:
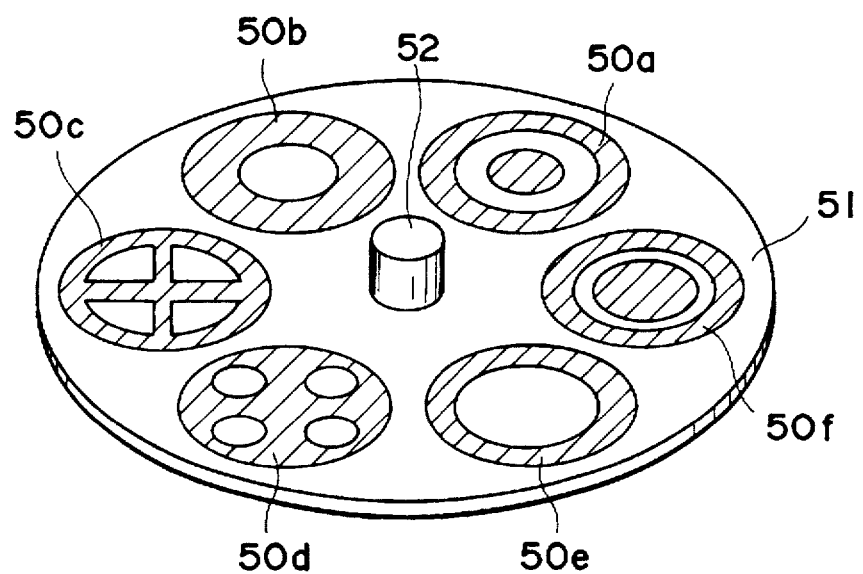
FIG. 21 is a perspective view to show an appearance of a changeover type aperture stop in the embodiment shown in FIG. 16.

Now, returning to FIG. 16, there are a plurality of aperture stops 50a–50f provided as a secondary light source distribution shaping means for shaping the light intensity distribution of secondary light sources into a predetermined light intensity distribution, at the position A2 of the plural light source images formed by the fly's eye lens 4 (the secondary light sources). The plurality of aperture stops are formed in a turret plate 51 arranged to rotate about a rotation shaft 52, as shown in FIG. 21. Rotating the turret plate 51 to change over the aperture stop 50a–50f, an aperture stop of a desired shape is set on the secondary light sources. The predetermined light intensity distribution is formed on the aperture stop thus set.

Here is explained shapes of the aperture stops formed in the turret plate 51. As shown in FIG. 21, the aperture stop 50a is one for first annular illumination having an annular (or doughnut) aperture, and the aperture stop 50b and aperture stop 50e are those for first and second normal illumination having respective circular apertures of mutually different opening diameters. The aperture stop 50c is one for first special oblique illumination having four sector apertures, and the aperture stop 50d is one for second special oblique illumination having four circular apertures. Further, the aperture stop 50f is one for second annular illumination having an annular zone ratio (a ratio between the outer diameter and the inner diameter of the annular aperture) different from that of the aperture stop 50a.

Figure 22:
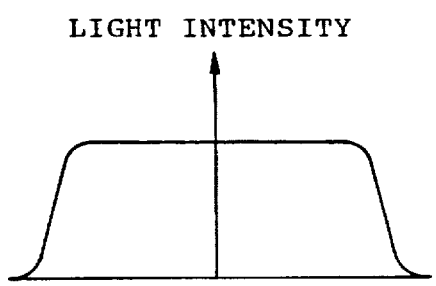
FIG. 22 is a drawing to show a state of light intensity distribution on the illuminated surface in the embodiment shown in FIG. 16.

Now, light beams from the secondary light sources in a predetermined shape having the light intensity distribution of the predetermined shape formed by the aperture stop 50a–50f of the predetermined shape are condensed by the condenser lens 6 as a condenser optical system to illuminate the reticle R as an illuminated object in a superimposed manner. With any aperture stop 50a–50f being set on the secondary light sources formed by the fly's eye lens 4, the light intensity distribution on the reticle R is uniform as shown in FIG. 22, and the reticle R is always illuminated uniformly.

Here, the reticle R is held by a reticle stage RS, the wafer W as a projection target is mounted on a wafer stage 8 arranged to two-dimensionally move, and the position B2 of reticle R and the position B3 of wafer W are set to be conjugate with each other with respect to the projection optical system 7. When the reticle R is uniformly illuminated, the predetermined circuit pattern formed on the reticle R is minified and projected onto the wafer W by the projection optical system 7, thereby transferring an image of the circuit pattern on the wafer W.

Here, the position A2 of the secondary light sources formed by the fly's eye lens is conjugate with the position A3 of the variable aperture stop 7a having a circular variable aperture provided at the pupil position of the projection optical system 7, so that images of the plural secondary light sources formed by the fly's eye lens 4 are formed on the variable aperture stop 7a in the projection optical system 7, thus illuminating the reticle R and wafer W under the so-called Köhler illumination. Further, the entrance surface B1 of the fly's eye lens, the position B2 of the reticle R, and the position B3 of the wafer W are conjugate with each other.

The above description concerned the configuration of the present embodiment, and switching operation of the illumination methods is next explained.

In FIG. 16, an input section 13 is provided for inputting information concerning selection of illumination method on the reticle R, by which the present embodiment is arranged as capable of selecting either one of the illumination methods including the "first annular illumination" by setting of the aperture stop 50a, the "second annular illumination" by setting of the aperture stop 50f, the "first normal illumination" by setting of the aperture stop 50b, the "second normal illumination" by setting of the aperture stop 50e, the "first special oblique illumination" by setting of the aperture stop 50c, and the "second special oblique illumination" by setting of the aperture stop 50d. This selection information is transmitted to a control unit 10. Then the control unit 10 executes control of a drive unit 11 for rotating the turret plate 51, based on the selection information from the input section 13, and also executes control of a drive unit 12 for changing the size of the aperture of the variable aperture stop 7a in the projection optical system 7, based on information concerning the illumination condition from the input section 13. The operation of the control unit 10 is next explained in further detail.

First, for setting the first normal illumination as an illumination state on the reticle R, input through a keyboard or the like as the input section 13 is the selection information concerning the "first normal illumination" or "second normal illumination" and information concerning an optimum illumination condition according to each fabrication process, for example a coherence factor defined by a ratio of a reticle-R-side numerical aperture $NA_1$ of the illumination optical system and a reticle-R-side numerical aperture $NA_2$ of the projection optical system 7, which is a so-called σ value (σ=$NA_1$/$NA_2$). Here, a difference between the "first normal illumination" and the "second normal illumination" resides in that σ values thereof are different from each other because of a difference in size between the circular apertures in the aperture stops.

For example, suppose the selection information concerning the "first normal illumination" is input into the input section 13. Based on this selection information, the control unit 10 drives the first drive unit 11 to rotate the turret plate 51 so that the aperture stop 50b is located at the position A2 of the plural light source images formed by the fly's eye lens 4. In addition, according to the illumination condition concerning a σ value input through the input section 13, the control unit 10 drives the second drive unit 12 to set the variable aperture stop in the projection optical system 7 to a specific diameter of circular aperture. By this, the first normal illumination is achieved under the predetermined σ value. The same operation as the above operation is also carried out when the selection information concerning the "second normal illumination" is input through the input section 13. Specifically, the control unit 10 executes the operation to set the aperture stop 50e to the position A2 of the plural light source images and the operation to set the aperture diameter of the variable aperture stop in the projection optical system 7 in accordance with the illumination condition concerning a σ value input, thereby achieving the second normal illumination under the predetermined σ value.

For switching the illumination from the normal illumination to desired oblique illumination on the reticle R, input through the input portion 13 is the selection information concerning either one of the "first annular illumination," "second annular illumination," "first special oblique illumination," and "second special oblique illumination" and the information of the σ value etc. as the optimum illumination condition according to each fabrication process. Here, the difference between the "first annular illumination" and the "second annular illumination" is a difference between annular zone ratios of the secondary light sources formed in an annular shape. Further, a difference between the "first special oblique illumination" and the "second special oblique illumination" resides in that light intensity distributions thereof of the secondary light sources are different from each other. Namely, the secondary light sources in the "first special oblique illumination" include a distribution of light intensities in four sector regions, while the secondary light sources in the "second special oblique illumination" include a distribution of light intensities in four circular regions.

For example, when the "first annular illumination" is selected, the control unit 10 controls the drive unit 11 to rotate the turret plate 51 so as to locate the aperture stop 50a at the position A2 of plural light source images; when the "second annular illumination" is selected, the control unit 10 controls the drive unit 11 to rotate the turret plate 51 so as to locate the aperture stop 50f at the position A2 of plural light source images. When the "first special oblique illumination" is selected, the control unit 10 controls the drive unit 11 to rotate the turret plate 51 so as to locate the aperture stop 50c at the position A2 of plural light source images; when the "second special oblique illumination" is selected, the control unit 10 controls the drive unit 11 to rotate the turret plate 51 so as to locate the aperture stop 50d at the position A2 of plural light source images.

Next, the control unit 10 drives the second drive unit 12 in accordance with the illumination condition concerning the σ value input through the input section 13 to set the variable aperture stop 7a in the projection optical system 7 to a predetermined aperture diameter.

As described, setting of the modified aperture stop 50a, 50c, 50d, 50f permits the secondary light sources to be formed according to the aperture configuration of the modified aperture stop, thereby permitting oblique illumination of reticle R and wafer W, and setting of the aperture diameter of the variable aperture stop 7a permits the wafer W to be illuminated at an optimum σ value. Thus, fine patterns can be transferred onto the wafer W under a deep depth of focus as compared with the first or second normal illumination by the aperture stop 50b or aperture stop 50e.

The present embodiment is arranged to input various conditions etc. for selecting the illumination method through the input section 13, but a modification may include a detecting unit 14 for reading information on the reticle R, as shown by the dashed line in FIG. 16. In this case, the information concerning the illumination method, the illumination condition, etc. is recorded for example by a bar code or the like at a position outside the region of the circuit pattern on the reticle R. The detecting unit 14 reads the information concerning the illumination method to transmit it to the control unit 10. The control unit 10 controls the drive units 11 and 12, as described above, based on the information concerning the illumination method and the illumination condition, etc. In this case, the control unit 10 may be arranged to control the drive units 11 and 12 after execution of predetermined arithmetic, judgment, etc., based on the information concerning the illumination method and illumination condition, etc.

As described above, the present embodiment forms the light intensity distribution in which intensities in the periphery are relatively increased to those in the central portion, as shown in FIG. 19, on the entrance surface of the fly's eye lens 4. Thus, the present embodiment can achieve any illumination method from the normal illumination, the oblique illumination (annular illumination and special oblique illumination), etc. at considerably high illumination efficiencies, as compared with the conventional apparatus, and can always realize projection exposure at high throughput.

The present embodiment is so arranged that in order to realize the oblique illumination, the turret plate 51 includes the aperture stop 50a for the "first annular illumination," the aperture stop 50f for the "second annular illumination," the aperture stop 50c for the "first special oblique illumination," and the aperture stop 50d for the "second special oblique illumination" and that in order to form light sources in an annular shape or in an offset state from the optical axis Ax, portions other than the annular aperture portion or the four offset aperture portions, respectively, are constructed of light-shielding portions formed to have the transmittance of zero. It is needless to mention that the light-shielding portions may be replaced by an optically transparent light-reducing member having the transmittance of about 30%. In this case, a preferred example may be constructed in such a manner that the member constituting the turret plate 51 is comprised of a glass substrate, chromium is vapor-deposited to form a thin film over the light-shielding portions, or that the light-reducing member is formed by lowering the vapor deposition density of the thin film of chromium.

The embodiment of FIG. 16 showed an example in which the collimator lens 3 directly forms the image of the reflecting surface 2R of the ellipsoidal mirror 2, but without having to be limited to it, the configuration as shown in FIG. 23 may be employed for example. This modification is different from the embodiment of FIG. 16 in that a relay optical system 31, 32 is placed between the collimator lens 3 and the fly's eye lens 4. The collimator lens 3 has a function to form an image of the reflecting surface 2R of the ellipsoidal mirror 2 at the position B0 and a function to collimate the light from the light source image formed by the ellipsoidal mirror 2. The relay lenses 31, 32 reimage the image of the reflecting surface 2R of the ellipsoidal mirror 2 formed at the position B0 by the collimator lens 3, at the position a. The collimator lens 3 and the relay lenses 31, 32 compose the collimator optical system.

In this case, the entrance surface 4a of the fly's eye lens 4 is located at the position b defocused from the position a of the image of the reflecting surface 2R of the ellipsoidal mirror 2 formed by the collimator optical system 3, 31, 32 to the light source side.

According to this arrangement, the distance can be taken long enough between the lens 32 closest to the illuminated surface, constituting the collimator optical system, and the image position a of the reflecting surface 2R of the ellipsoidal mirror 2, whereby the entrance surface 4a of the fly's eye lens 4 can be set sufficiently distant from the imaging position a. If with the embodiment of FIG. 16 there is a possibility of mechanical interference between the collimator lens 3 and the fly's eye lens 4 because of a short distance between the collimator lens 3 and the image position a of the reflecting surface 2R of the ellipsoidal mirror 2, it is preferred to employ the configuration as shown in FIG. 23.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

The basic Japanese Application No. 286217/1994 (6-286217) filed on Nov. 21, 1994, is hereby incorporated by reference.

What is claimed is:

1. An illumination optical apparatus for uniformly illuminating an illuminated surface, comprising:

a light source;

a collector mirror having a reflecting surface of a rotationally symmetric shape, said collector mirror reflecting and collecting light from said light source by the reflecting surface to form a light source image;

a collector optical system for collecting light from the light source image formed by said collector mirror;

an optical integrator for splitting the light from said collector optical system to form a plurality of secondary light sources, an entrance surface of said optical integrator being located at a position defocused from a position where an image of the reflecting surface of said collector mirror is formed by said collector optical system, to a side of said light source; and a condenser optical system for condensing light from the secondary light sources formed by said optical integrator to illuminate said illuminated surface in a superimposed manner.

2. The illumination optical apparatus according to claim 1, wherein said optical integrator is a fly's eye lens.

3. The illumination optical apparatus according to claim 1, wherein said light source is a discharge lamp, said discharge lamp having an anode and a cathode disposed as opposed to each other along and on a symmetry axis of said collector mirror, said cathode being located on a side of said collector optical system with respect to said anode.

4. The illumination optical apparatus according to claim 3, wherein said discharge lamp is a mercury arc lamp.

5. The illumination optical apparatus according to claim 3, wherein said collector mirror is an ellipsoidal mirror, one focus of said ellipsoidal mirror being located between said anode and said cathode.

6. The illumination optical apparatus according to claim 1, further comprising a secondary light source distribution shaping portion for shaping a light intensity distribution of the secondary light sources formed by said optical integrator into a predetermined light intensity distribution.

7. The illumination optical apparatus according to claim 6, wherein said secondary light source distribution shaping portion comprises a plurality of aperture stops arranged as switchable, substantially on an exit surface of said optical integrator.

8. The illumination optical apparatus according to claim 6, wherein said secondary light source distribution shaping portion comprises an aperture stop having a circular aperture portion with a center thereof on an optical axis of said condenser optical system and wherein in said aperture portion a central area thereof including the optical axis of said condenser optical system is a light-shielding portion.

9. The illumination optical apparatus according to claim 3, wherein said secondary light source distribution shaping portion comprises an aperture stop having a circular aperture portion with a center thereof on an optical axis of said condenser optical system and wherein in said aperture portion a central area thereof including the optical axis of said condenser optical system is a light-reducing portion.

10. The illumination optical apparatus according to claim 6, wherein said secondary light source distribution shaping portion comprises an aperture stop having aperture portions in peripheral areas offset from an optical axis of said condenser optical system and wherein a central area including the optical axis of said condenser optical system is a light-shielding portion.

11. The illumination optical apparatus according to claim 6, wherein said secondary light source distribution shaping portion comprises an aperture stop having aperture portions in peripheral areas offset from an optical axis of said condenser optical system and wherein a central area including the optical axis of said condenser optical system is a light-reducing portion.

12. The illumination optical apparatus according to claim 1, wherein said collector optical system comprises:

a collimator optical system for forming an image of the reflecting surface of said collector mirror and collimating the light from the light source image formed by said collector mirror; and a relay optical lens for reimaging the image of the reflecting surface of said collector mirror formed by said collimator lens.

13. A projection exposure apparatus for transferring a pattern of a photomask onto a photosensitive substrate, comprising:

a light source;

a collector mirror having a reflecting surface of a rotationally symmetric shape, said collector mirror reflecting and collecting light from said light source by the reflecting surface to form a light source image;

a collector optical system for collecting light from the light source image formed by said collector mirror;

an optical integrator for splitting the light from said collector optical system to form a plurality of secondary light sources, an entrance surface of said optical integrator being located at a position defocused from a position where an image of the reflecting surface of said collector mirror is formed by said collector optical system, to a side of said light source;

a condenser optical system for condensing light from the secondary light sources formed by said optical integrator to illuminate said photomask in a superimposed manner;

a first stage for supporting said photomask;

a projection optical system for making a position of said photomask conjugate with a position of said photosensitive substrate to guide light from said photomask to said photosensitive substrate; and a second stage for supporting said photosensitive substrate; and a second stage for supporting said photosensitive substrate.

14. The projection exposure apparatus according to claim 13, wherein said light source is a discharge lamp, said discharge lamp having an anode and a cathode disposed as opposed to each other along and on a symmetry axis of said collector mirror, said cathode being located on a side of said collector optical system with respect to said anode.

15. The projection exposure apparatus according to claim 13, further comprising a secondary light source distribution shaping portion for shaping a light intensity distribution of the secondary light sources formed by said optical integrator into a predetermined light intensity distribution.

16. The projection exposure apparatus according to claim 13, wherein said collector optical system comprises:

a collimator optical system for forming an image of the reflecting surface of said collector mirror and collimating the light from the light source image formed by said collector mirror; and a relay optical lens for reimaging the image of the reflecting surface of said collector mirror formed by said collimator lens.

17. According to claim 14, further comprising a secondary light source distribution shaping portion for shaping light intensity distribution of the secondary light sources formed by said optical integrator into a predetermined light intensity distribution.

18. According to claim 17, wherein said secondary light source distribution shaping portion comprises a plurality of aperture stops arranged as switchable, substantially on an exit surface of said optical integrator.

19. According to claim 14, further comprising:
- a secondary light source distribution shaping portion for shaping a light intensity distribution of the secondary light sources formed by said optical integrator into a predetermined light intensity distribution,
- said secondary light source distribution shaping portion comprising a first, second and third aperture stops arranged as switchable, substantially on an exit surface of said optical integrator,
- one of said aperture stops has a circular aperture portion with a center thereof on an optical axis of said condenser optical system, and
- in said aperture portion a central area thereof including the optical axis of said condenser optical system being formed with a light-shielding portion.

20. According to claim 17, wherein said secondary light source distribution shaping portion comprising a first, second and third aperture stops arranged as switchable, substantially on an exit surface of said optical integrator,
- said first aperture stop has a first circular aperture portion with a center thereof on an optical axis of said condenser optical system,
- said second aperture stop has a second circular aperture portion with a center thereof on an optical axis of said condenser optical system and in said second aperture stop, a central area thereof including the optical axis of said condenser optical system is formed with a light-shielding portion, and
- said third aperture stop has a plurality of third aperture portions in a peripheral area which is offset with respect to the optical axis of said condenser optical system.

21. According to claim 14, wherein said collector mirror is an ellipsoidal mirror, one focus of said ellipsoidal mirror being located between said anode and said cathode.

22. An exposure apparatus according to claim 21, further comprising a secondary light source distribution shaping portion for shaping a light intensity distribution of the secondary light sources formed by said optical integrator into a predetermined light intensity distribution.

23. A method according to claim 22, wherein said secondary light source distribution shaping portion comprising a first, second and third aperture stops arranged as switchable, substantially on an exit surface of said optical integrator,
- said first aperture stop has a first circular aperture portion with a center thereof on an optical axis of said condenser optical system,
- said second aperture stop has a second circular aperture portion with a center thereof on an optical axis of said condenser optical system and in said second aperture stop, a central area thereof including the optical axis of said condenser optical system is formed with a light-shielding portion, and
- said third aperture stop has a plurality of third aperture portions in a peripheral area which is offset with respect to the optical axis of said condenser optical system.

24. A method according to claim 13, further comprising the steps of:
- illuminating said pattern with light from said condenser optical system; and
- projecting said pattern of said mask on said photosensitive substrate through said projection optical system.

25. A method according to claim 14, further comprising the steps of:
- illuminating said pattern with light from said condenser optical system; and
- projecting said pattern of said mask on said photosensitive substrate through said projection optical system.

26. A method according to claim 17, further comprising the steps of:
- illuminating said pattern with light from said condenser optical system; and
- projecting said pattern of said mask on said photosensitive substrate through said projection optical system.

27. A method according to claim 20, further comprising the steps of:
- illuminating said pattern with light from said condenser optical system; and
- projecting said pattern of said mask on said photosensitive substrate through said projection optical system.

28. A method according to claim 21, further comprising the steps of:
- illuminating said pattern with light from said condenser optical system; and
- projecting said pattern of said mask on said photosensitive substrate through said projection optical system.

29. A method according to claim 22, further comprising the steps of:
- illuminating said pattern with light from said condenser optical system; and
- projecting said pattern of said mask on said photosensitive substrate through said projection optical system.

30. A method according to claim 23, further comprising the steps of:
- illuminating said pattern with light from said condenser optical system; and
- projecting said pattern of said mask on said photosensitive substrate through said projection optical system.

* * * * *